(12) United States Patent
Hsu

(10) Patent No.: US 7,453,155 B2
(45) Date of Patent: Nov. 18, 2008

(54) METHOD FOR FABRICATING A FLIP CHIP PACKAGE

(75) Inventor: Shih-Ping Hsu, Taoyuan County (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 427 days.

(21) Appl. No.: 11/162,328

(22) Filed: Sep. 7, 2005

(65) Prior Publication Data
US 2006/0228829 A1  Oct. 12, 2006

(30) Foreign Application Priority Data
Apr. 8, 2005  (TW) .............................. 94111178 A

(51) Int. Cl.
*H01L 23/52* (2006.01)
*H01L 23/48* (2006.01)
*H01L 23/485* (2006.01)
*H01L 23/488* (2006.01)

(52) U.S. Cl. .................. 257/778; 257/737; 257/738; 257/780; 257/779; 257/E23.021; 257/E23.023

(58) Field of Classification Search ................ 257/778, 257/780, 737, 738, 779, E23.021, E23.023
See application file for complete search history.

(56) References Cited

U.S. PATENT DOCUMENTS

| 4,818,728 | A  | * | 4/1989 | Rai et al. ............... 438/108 |
| 6,452,280 | B1 | * | 9/2002 | Shiraishi et al. ......... 257/778 |
| 6,689,639 | B2 | * | 2/2004 | Sakuyama et al. ....... 438/118 |

* cited by examiner

Primary Examiner—Luan Thai
(74) Attorney, Agent, or Firm—Winston Hsu

(57) ABSTRACT

A flip chip packaging method is disclosed. First, a substrate is provided, in which the substrate comprises a plurality of integrated circuit (IC) package substrate units therein and the surface of each IC package substrate unit comprises a plurality of connecting pads. Next, an insulating layer with patterns is formed on the substrate and the connecting pads and a plurality of openings by partially exposing the upper surface of the connecting pads. Next, a conductive material is disposed within each opening. Next, a plurality of chips is provided, in which a plurality of conductive bumps is formed over the bottom surface of the chip. Lastly, the chips are mounted over the surface of the IC package substrate unit and the substrate is separated into a plurality of flip chip package structures, in which the surface of each flip chip package structure includes at least one chip.

11 Claims, 19 Drawing Sheets

METHOD FOR FABRICATING A FLIP CHIP PACKAGE

BACKGROUND OF THE INVENTION

1. Field of the Invention

The present invention relates to a flip-chip packaging method, and more particularly, to a method of mounting a chip onto a flip-chip packaging substrate.

2. Description of the Prior Art

In recent years, as portable electronic products such as notebook computers, personal digital assistants (PDA), and cellular phones become smaller and as the function of central processing unit (CPU) and memory modules become more complex, the manufacturing of semiconductors has also advanced in a direction of high density packaging, thereby developing numerous packaging products with the characteristics of having small size and light weight. In contrast to the conventional packaging structure, the flip chip (FC) packaging structure widely used today has the advantage of fast heat dissipation, low inductance, multi-terminal property, and smaller size chips. By enhancing and expanding these advantages, the flip chip packaging technique has the potential to grow exponentially in the near future.

Please refer to FIG. 1. FIG. 1 is a perspective diagram showing the cross-section of a flip-chip packaging structure 30 according to the prior art. As shown in FIG. 1, the conventional flip chip packaging structure 30 includes a die 32, in which the die 32 further includes an active surface 34 and a plurality of connecting pads (not shown) disposed for the active surface 34. Additionally, the flip chip packaging structure 30 includes a substrate 36, in which the upper surface and bottom surface of the substrate 36 includes a solder mask layer 38 and 45. Preferably, the substrate 36 is a multi-layer substrate and the solder mask layer 38 includes a plurality of openings for exposing the bump pad of the substrate 36.

During the process of packaging, the active surface 34 of the die 32 is positioned towards the solder mask layer 38 of the substrate 36, such that the position of each connecting pad (not shown) is arranged corresponding to the position of each bump pad (not shown). Next, a plurality of solder balls 42 are disposed between the connecting pads and the bump pads for providing a physical connection between each connecting pad and each bump pad. Depending on fabrication processes and design of the devices, an under bump metallurgy layer (not shown) is often utilized as a adhesive layer, resist layer, wetting layer, or a conductive layer between each connecting pad and the solder ball 42. In the same time, the die 32 also includes at least an integrated circuit (IC) in the level of very large scale integration (VLSI) or ultra large scale integration (ULSI), in which the integrated circuits are electrically connected to the substrate 36 through the connecting pads, solder balls 42, and bump pads described previously.

Additionally, the flip chip packaging structure 30 also includes an underfill material layer 44, in which the underfill material layer 44 is formed to completely fill the gap between the substrate 36 and the die 32 for protecting the flip chip packaging structure 30 from influences from the external environment and for reducing the stress at the connecting end of the solder ball 42. Preferably, the solder mask layer 45 includes a plurality of openings for exposing the solder ball pad 46 of the substrate and the flip chip packaging structure 30 also includes a plurality of solder balls 48 formed under each solder ball pad 46.

Essentially, the conventional method of fabricating a flip chip package usually requires many times reflow process, which ultimately brings challenges to the reliability of the final product. Additionally, phenomenon such as substrate cracks will often result due to incompatible coefficients of thermal expansion (CTE) between the substrate and the underfill layer, thereby influencing the quality of the product. Moreover, one other major disadvantage of the conventional method lies in the fact that the processed substrates are shipped in a one-piece manner to the packaging facility for further packaging. By packaging the finished substrate one piece at a time, the overall cost for acquiring all the necessary equipment and facilities will increase and the final production yield will also be significantly limited.

SUMMARY OF THE INVENTION

It is therefore an objective of the present invention to provide a flip chip packaging method for solving the above-mentioned problems.

According to the present invention, a flip chip packaging method comprises: providing a package substrate, in which the substrate comprises a plurality of integrated circuit (IC) package substrate units therein and the surface of each IC package substrate unit comprises a plurality of connecting pads; forming an insulating layer with patterns on the substrate and the connecting pads and a plurality of openings by partially exposing the upper surface of the connecting pads; disposing a conductive material within each opening; providing a plurality of chips, wherein a plurality of conductive bumps is formed over the bottom surface of the chip; mounting the chips over the surface of the IC package substrate unit; and separating the substrate into a plurality of flip chip package structures, wherein the surface of each flip chip package structure includes at least one chip. Additionally, the method of forming the insulating can also be achieved by first forming a fully cured first insulating layer with patterns on the substrate and the connecting pads for forming a plurality of openings by partially exposing the upper surface of the connecting pads, and forming a pre-cured second insulating layer with patterns over the surface of the first insulating layer and exposing each opening, in which the second insulating layer is utilized as an adhesive layer between the substrate and each chip.

By placing the chip over the surface of the pre-cured insulating layer and then separating the IC package substrate units into a plurality of packaging structures, the present invention is able to greatly decrease the number of steps required for packaging, reduce the amount of materials used, ensure the quality of the package by preventing incompatible coefficient of thermal expansions, reduce overall cost and increase the production yield.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
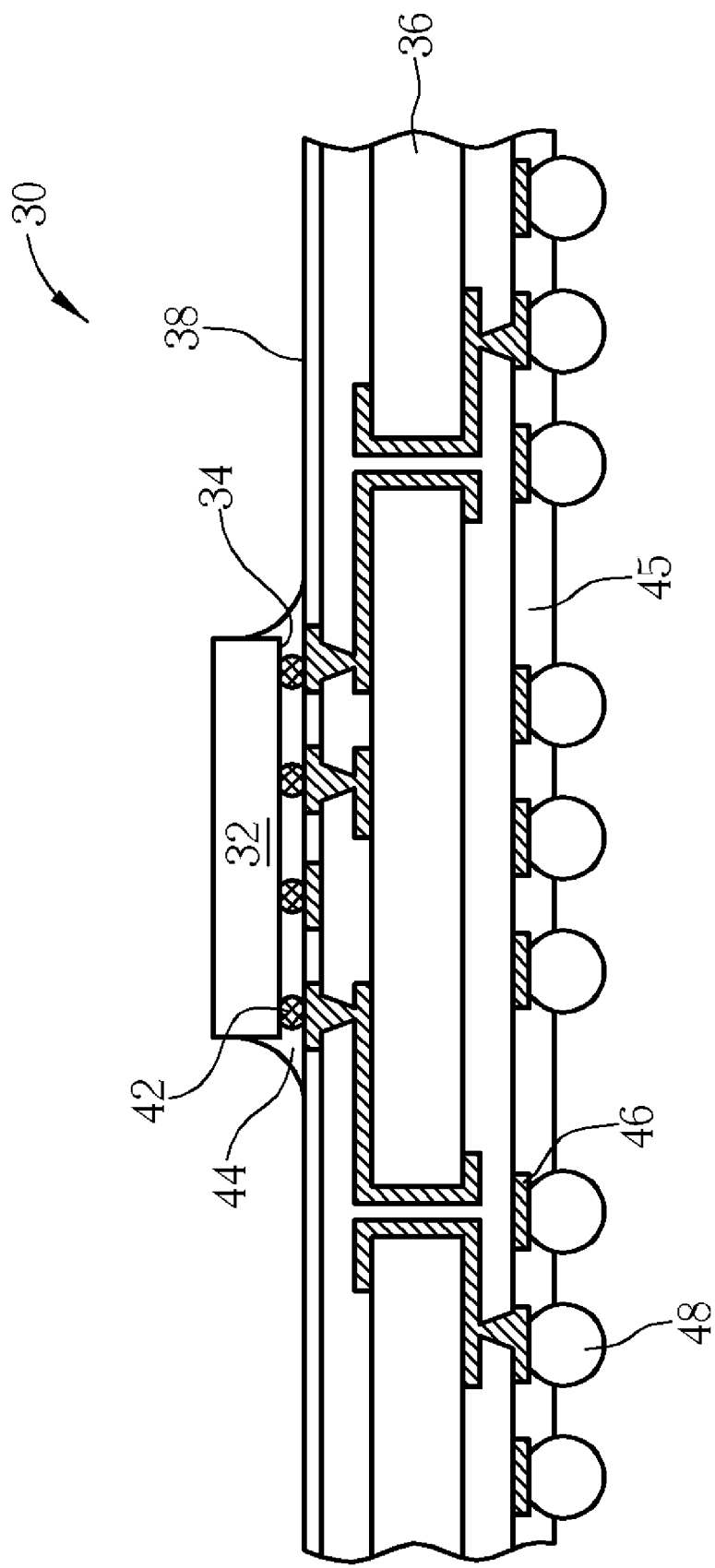
FIG. 1 is a perspective diagram showing the cross-section of a flip chip packaging structure according to the prior art.
Figure 2:
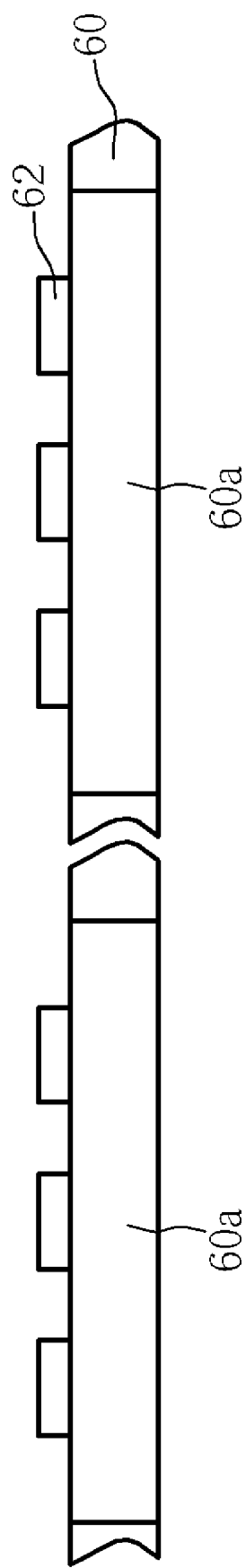
FIG. 2 through FIG. 8 are perspective diagrams showing the flip chip packaging method according to the first embodiment of the present invention.
Figure 3:
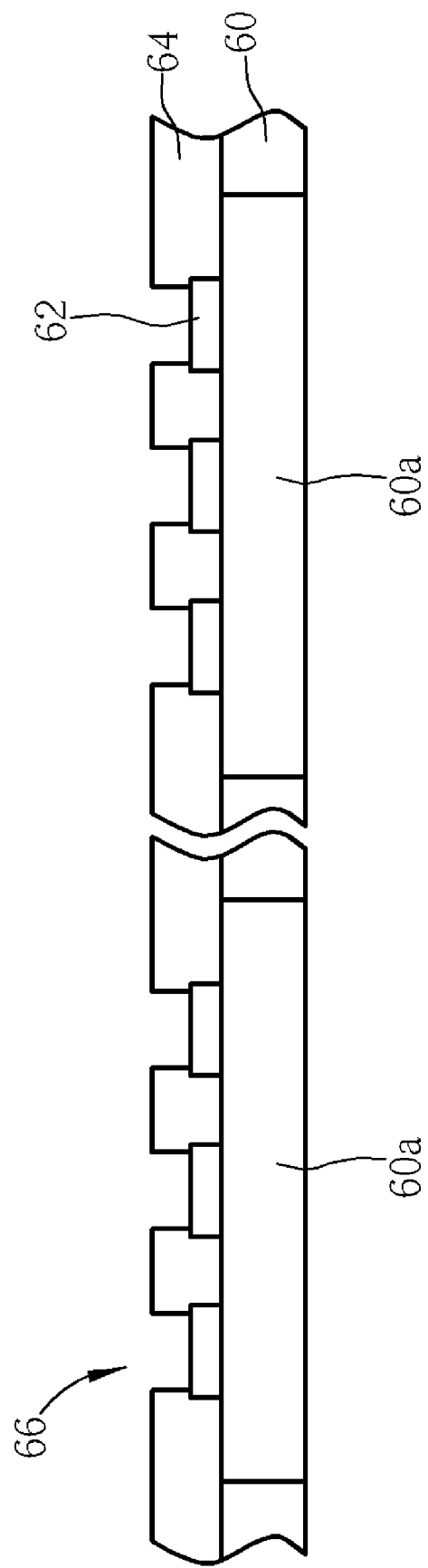

Please refer to FIG. 2 through FIG. 8. FIG. 2 through FIG. 8 are perspective diagrams showing the flip chip packaging method according to the first embodiment of the present invention. As shown in FIG. 2, a package substrate 60, such as a circuit board with a build up circuit layer is first provided. The substrate 60 includes a plurality of IC package substrate units 60a therein, in which at least one metal inter-connective layer (not shown) is formed within each IC package substrate unit 60a and a plurality of connecting pads 62 is disposed over the surface of the IC package substrate unit 60a. Next, an insulating layer 64 with patterns is formed on the substrate 60 and the connecting pads 62, in which a plurality of openings 66 is also formed by partially exposing the upper surface of the connecting pads 62, as shown in FIG. 3. Preferably, the insulating layer 62 is a pre-curing adhesive layer and the materials utilized for composing the insulating layer 64 include photosensitive or non-photosensitive resins. Moreover, materials utilized for forming the insulating layer 64 can be selected from resins, epoxy, or organic polymers including Ajinomoto build up film (ABF), Aramid, Polypropylene (PP), Polyimide (PI), Benzocyclobutene (BCB), Liquid crystal polymer (LCP), and Polytetrafluoroethylene (PTFE).

Figure 4:
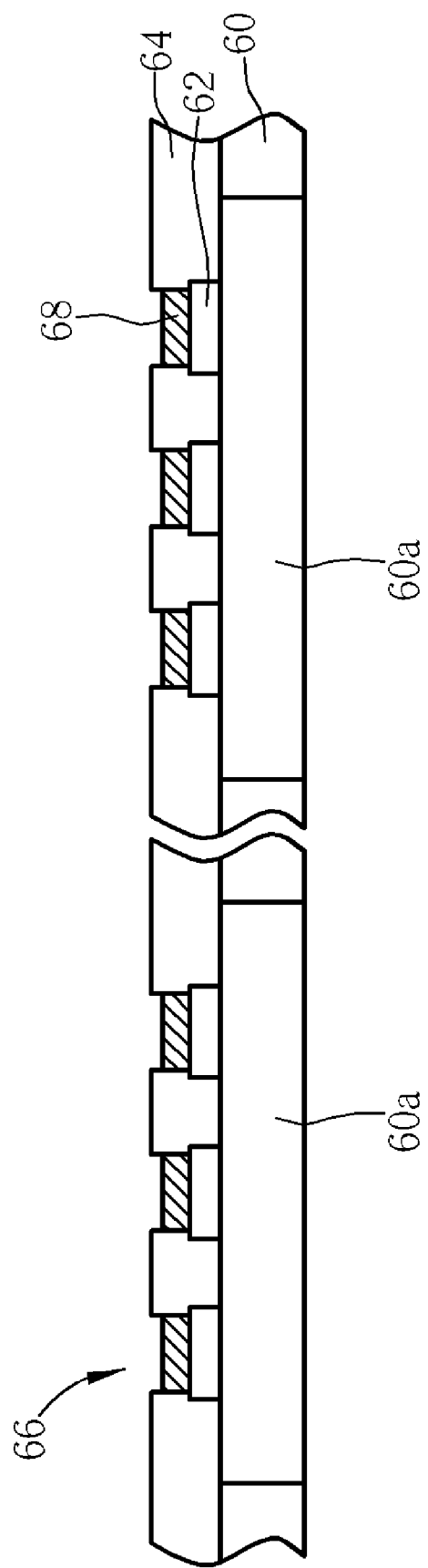
Figure 5:
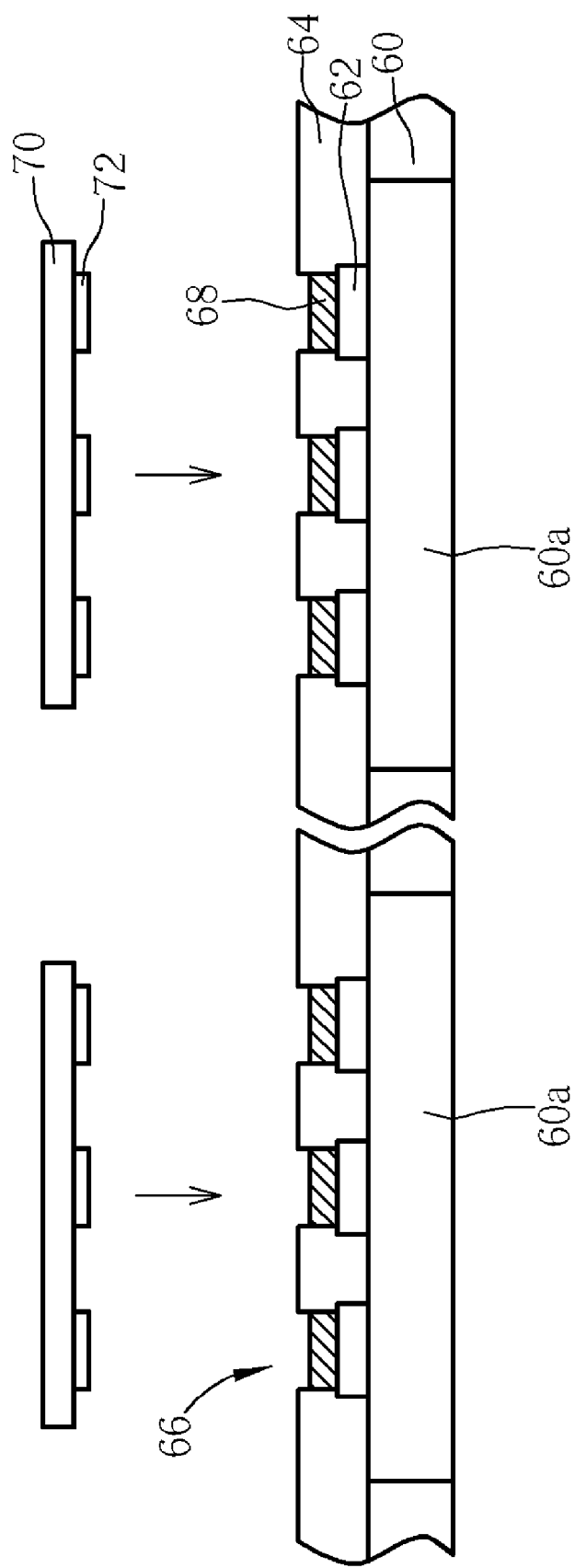
Figure 6:
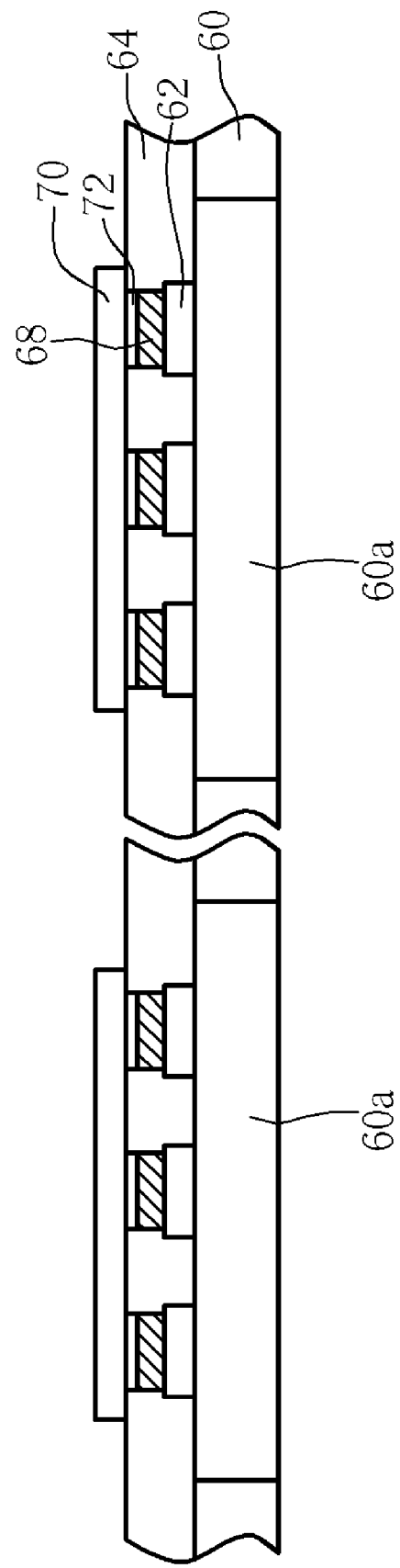
Figure 7:
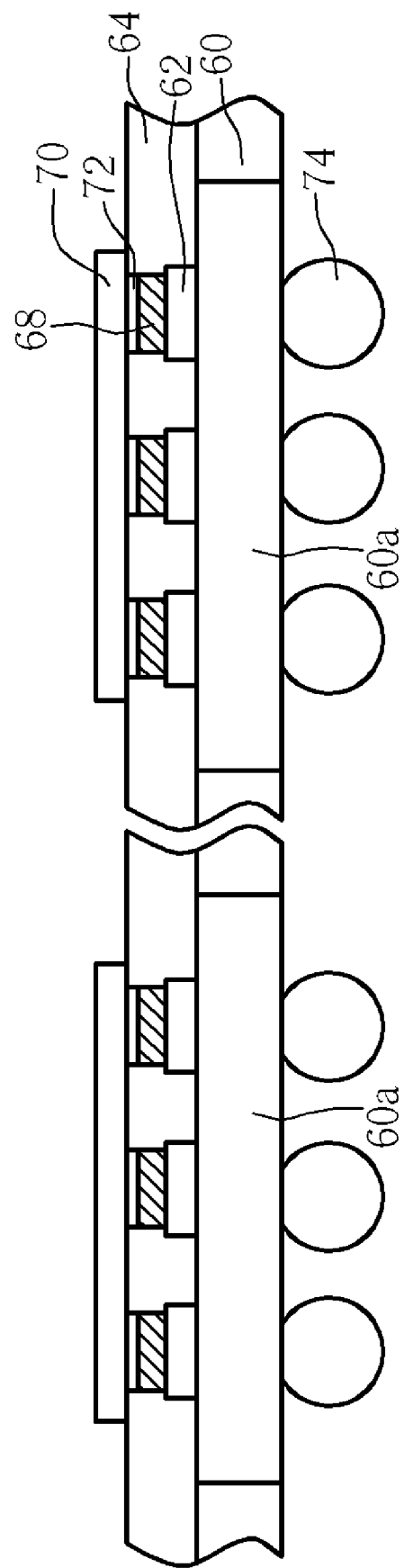

Next, a conductive material 68 such as solder, copper paste, or silver paste is disposed into each opening 66, in which the conductive material 68 is utilized as a connecting agent for electrically connecting to the chip 70, as shown in FIG. 4. Next, a plurality of chips 70 is provided and each chip 70 is mounted to the surface of each IC package substrate unit 60a via the insulating layer 64, in which the bottom surface of the chip 70 also includes a plurality of conductive bumps 72, as shown in FIGS. 5 and 6. Preferably, a pre-curing adhesive layer (not shown) can also be formed over the bottom surface of the chip 70 for mounting each chip 70 onto the surface of the IC package substrate unit 60a with the plurality of conductive bumps 72. Due to the fact that the insulating layer 64 is a pre-curing adhesive layer, each chip 70 is able to be slightly pushed into the insulating layer 64 during the mounting process. Next, a curing process is performed to harden the insulating layer 64 which has been pre-cured and to establish a tight bonding among each connecting pad 62, the conductive material 68, and each conductive bump 72. Next, a solder ball mounting process is performed to form a plurality of solder balls 74 on the plurality of solder pads (not shown) of the bottom surface of each IC package substrate unit 60a, as shown in FIG. 7. Lastly, the substrate 60 is divided into a plurality of flip chip packaging structures 78, in which the surface of each flip chip packaging structure 78 includes at least one chip 70, as shown in FIG. 8.

Figure 8:
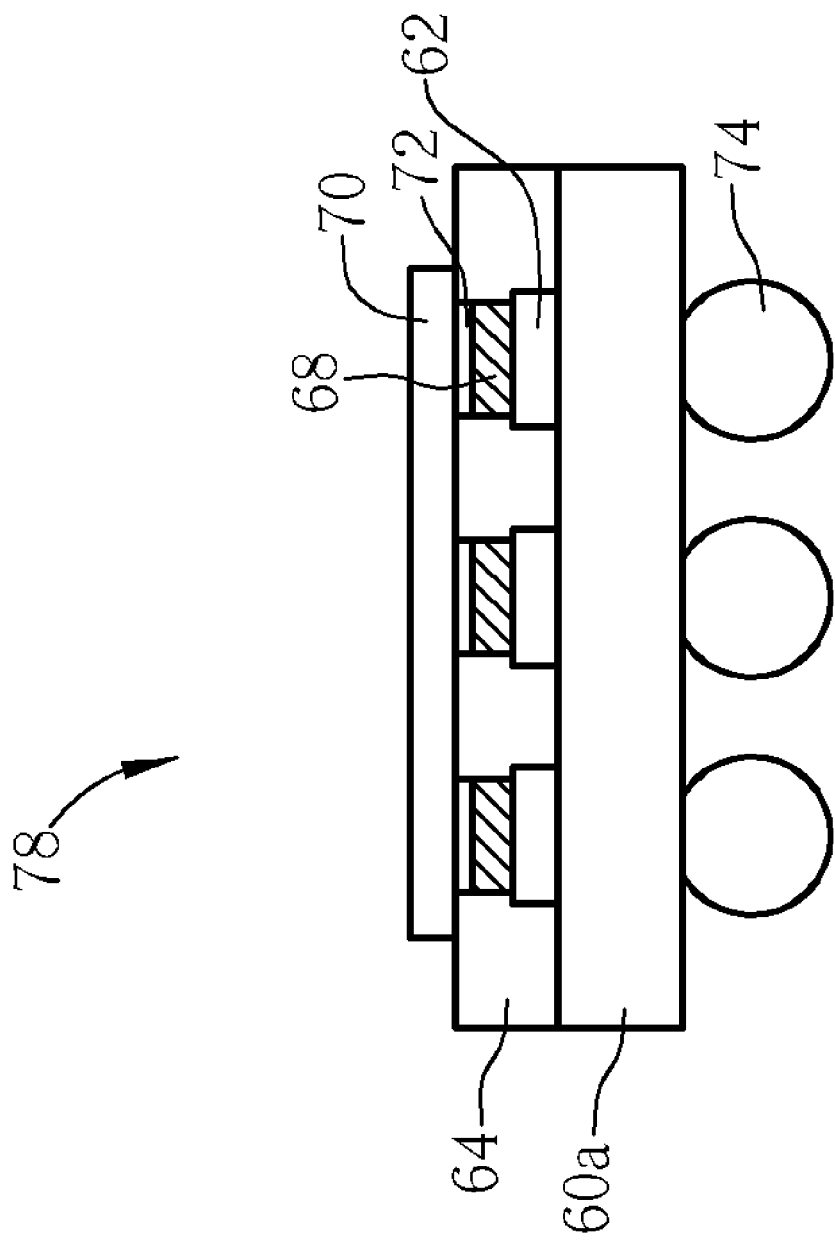

As shown in FIG. 8, the present invention also discloses a flip chip packaging structure 78. Preferably, the packaging structure 78 includes an IC package substrate unit 60a, in which a plurality of connecting pads 62 is disposed over the surface of the IC package substrate unit 60a; an insulating layer 64 with patterns disposed on the IC package substrate unit 60a and the connecting pads 62, in which a plurality of openings is formed by partially exposing the upper surface of the connecting pads 62; a conductive material 68 disposed within each opening; and a chip 70 mounting on the surface of the IC package substrate unit 60a via the insulating layer 64, in which a plurality of conductive bumps 72 is disposed over the bottom surface of the chip 70. Additionally, a plurality of solder balls 74 can be disposed over the bottom surface of IC package substrate unit 60a for providing an electrical connection to the external devices. Moreover, the bottom surface of the each chip 70 may also include a pre-curing adhesive layer (not shown) disposed between the conductive bumps 72 for increasing the adhesion between the chip 70 and the insulating layer 64.

Figure 9:
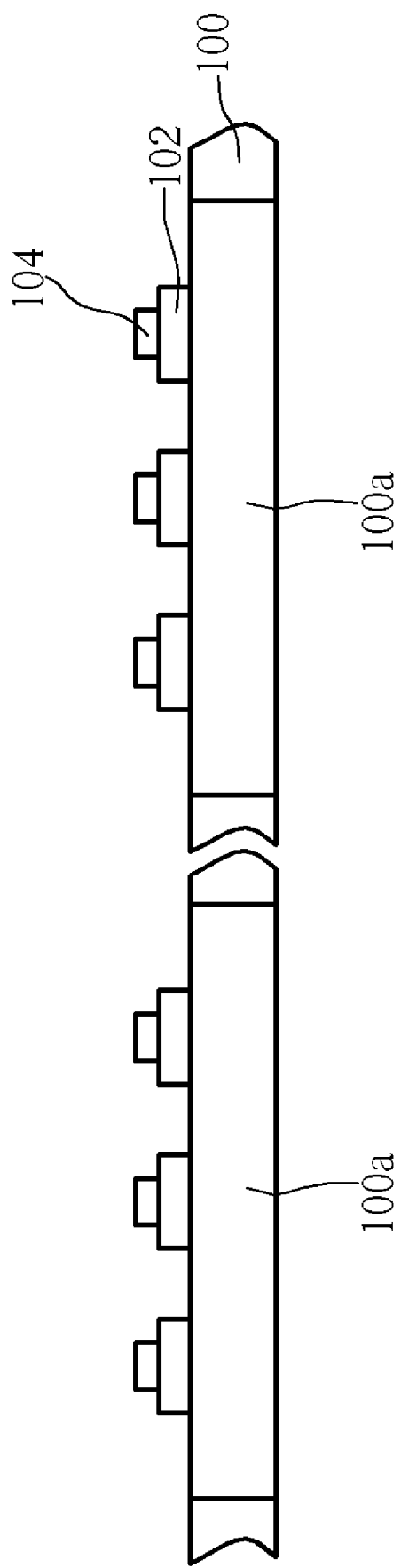
FIG. 9 through FIG. 11 are perspective diagrams showing the flip chip packaging method according to the second embodiment of the present invention.
Figure 10:
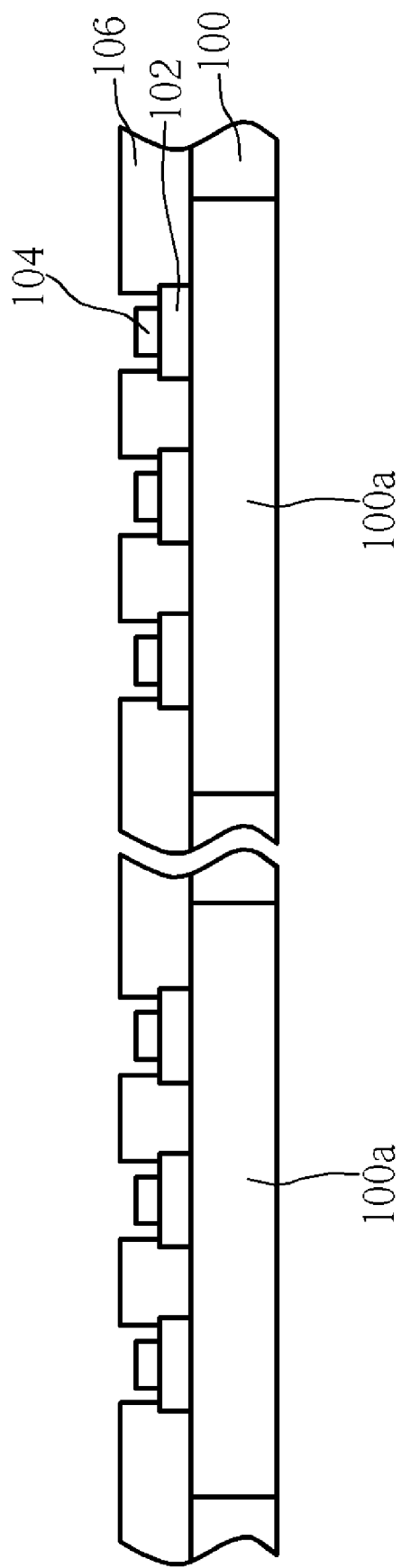
Figure 11:
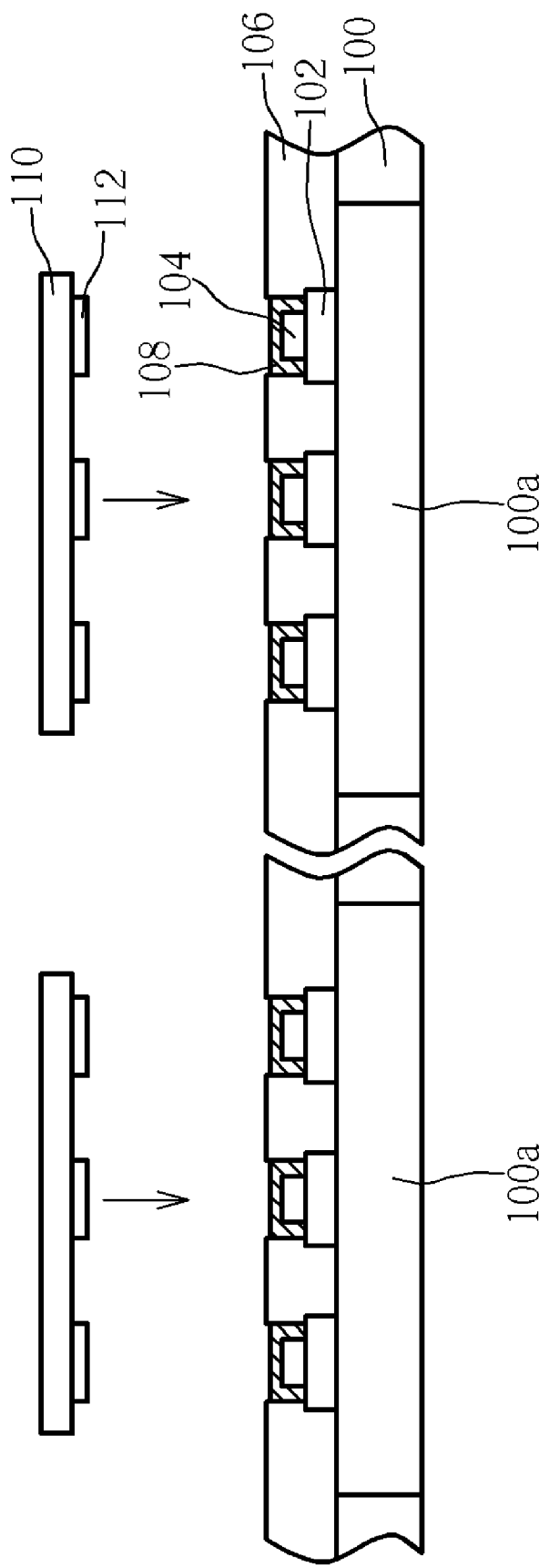

Please refer to FIG. 9 through FIG. 11. FIG. 9 through FIG. 11 are perspective diagrams showing the flip chip packaging method according to the second embodiment of the present invention. As shown in FIG. 9, a package substrate 100, such as a circuit board with a build up circuit layer is first provided. The substrate 100 includes a plurality of IC package substrate units 100a therein, in which at least one metal inter-connective layer (not shown) is formed within each IC package substrate unit 100a and a plurality of connecting pads 102 is disposed over the surface of the IC package substrate unit 100a. Next, a metal bump 104 is formed in the center surface of each connecting pad 102 for increasing the adhesive area and heat distribution between the conductive material 108 formed afterwards and the connecting pads 102. Preferably, the metal bump 104 is comprised of a single layer or multi-layers of metal selectively chosen from copper, nickel, gold, silver, palladium, or tin. The metal bump 104 also can be made of solder paste.

Next, an insulating layer 106 with patterns is formed on the substrate 100 and the connecting pads 102, in which a plurality of openings is also formed by partially exposing the upper surface of the connecting pads 102, as shown in FIG. 10. Preferably, the insulating layer 106 is a pre-curing adhesive layer and the materials utilized for composing the insulating layer 106 includes photosensitive or non-photosensitive resins, and similar to the previous embodiment, materials utilized for forming the insulating layer 106 can be selected from resins, epoxy, or organic polymers including Ajinomoto build up film (ABF), Aramid, Polypropylene (PP), Polyimide (PI), Benzocyclobutene (BCB), Liquid crystal polymer (LCP), and Polytetrafluoroethylene, (PTFE). Next, a conductive material 108 such as solder, copper paste, or silver paste is disposed into each opening, in which the conductive material 108 is utilized as a connecting agent for electrically connecting to the chip 110, as shown in FIG. 11. Next, a plurality of chips 110 is mounted to the surface of each IC package substrate unit 100a via the insulating layer 106, in which the bottom surface of the chip 110 also includes a plurality of conductive bumps 112. Additionally, a pre-curing adhesive layer (not shown) can also be formed over the bottom surface of the chip 110 for mounting each chip 110 onto the surface of the IC package substrate unit 100a. Next, a curing process is performed to harden the insulating layer 106 which has been pre-cured and to establish a tight bonding among the connecting pads 102, the metal bump 104, the conductive material 108, and each conductive bump 112. Next, a solder ball mounting process (not shown) is performed to form a plurality of solder balls on the plurality of solder pads (not shown) of the bottom surface of the substrate 100. Lastly, the substrate 100 is divided into a plurality of flip chip packaging structures, in which the surface of each flip chip packaging structure includes at least one chip 100.

Figure 12:
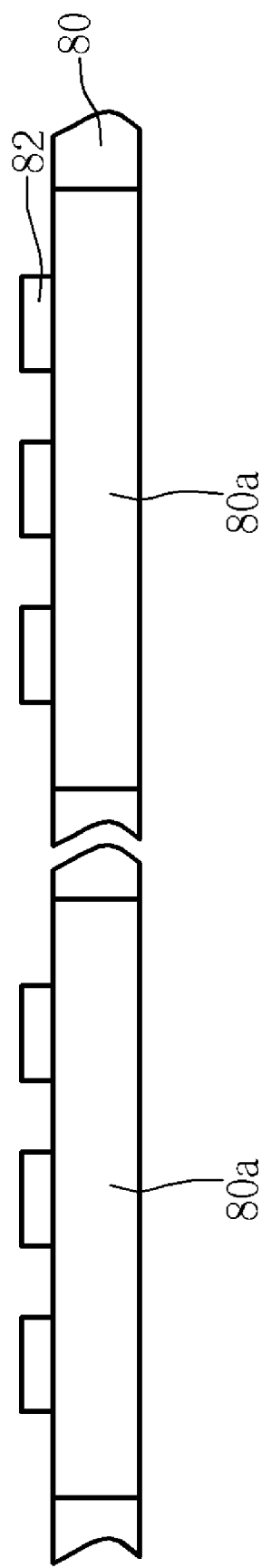
FIG. 12 through FIG. 15 are perspective diagrams showing the flip chip packaging method according to the third embodiment of the present invention.
Figure 13:
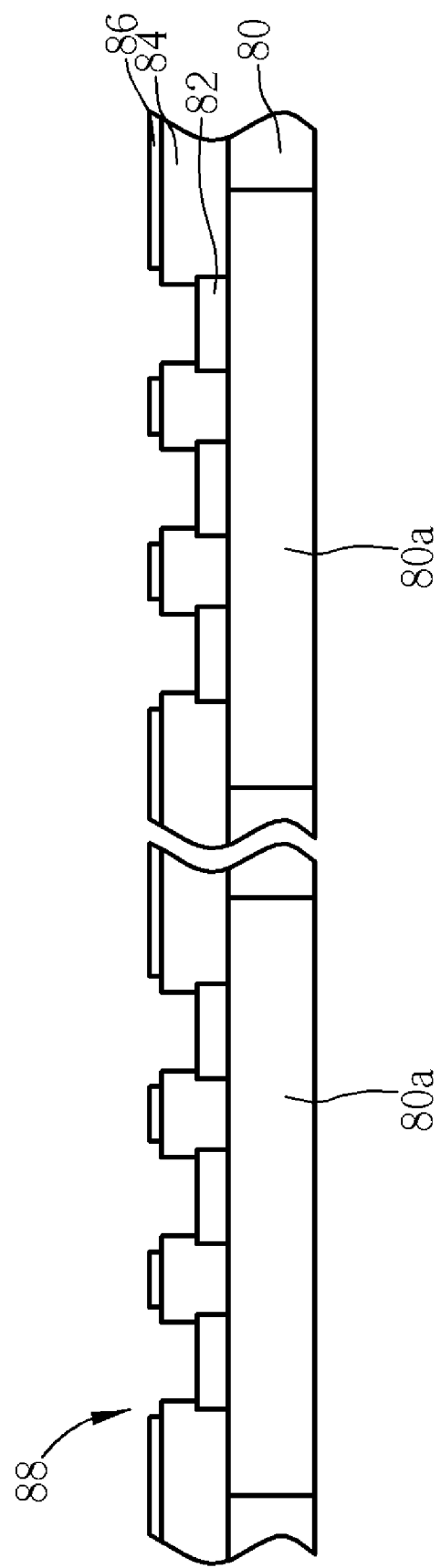

Please refer to FIG. 12 through FIG. 15. FIG. 12 through FIG. 15 are perspective diagrams showing the flip chip packaging method according to the third embodiment of the present invention. As shown in FIG. 12, a package substrate 80, such as a circuit board with a build up circuit layer is first provided. The substrate 80 includes a plurality of IC package substrate units 80a therein, in which at least one metal interconnective layer (not shown) is formed within each IC package substrate unit 80a and a plurality of connecting pads 82 is disposed over the surface of the IC package substrate unit 80a. Next, a first insulating layer 84 with patterns is formed on the substrate 80 and the connecting pads 82, in which a plurality of openings 88 is formed by partially exposing the upper surface of the connecting pads 82, as shown in FIG. 13. Next, a second insulating layer 86 with patterns is disposed over the surface of the first insulating layer 82, in which the openings 88 are exposed. In contrast to the previous embodiments, the first insulating layer 84 is a fully cured material whereas the second insulating layer 86 is a pre-curing material, in which the first insulating layer 84 and the second insulating layer 86 are utilized as an adhesive layer between the substrate 80 and other chips. Additionally, the first insulating layer 84 and the second insulating layer 86 can be made of same or different materials, such that the materials can be selected from photosensitive or non-photosensitive polymer resins, or materials utilized for the insulating layer 64 of the first embodiment of the present invention.

Figure 14:
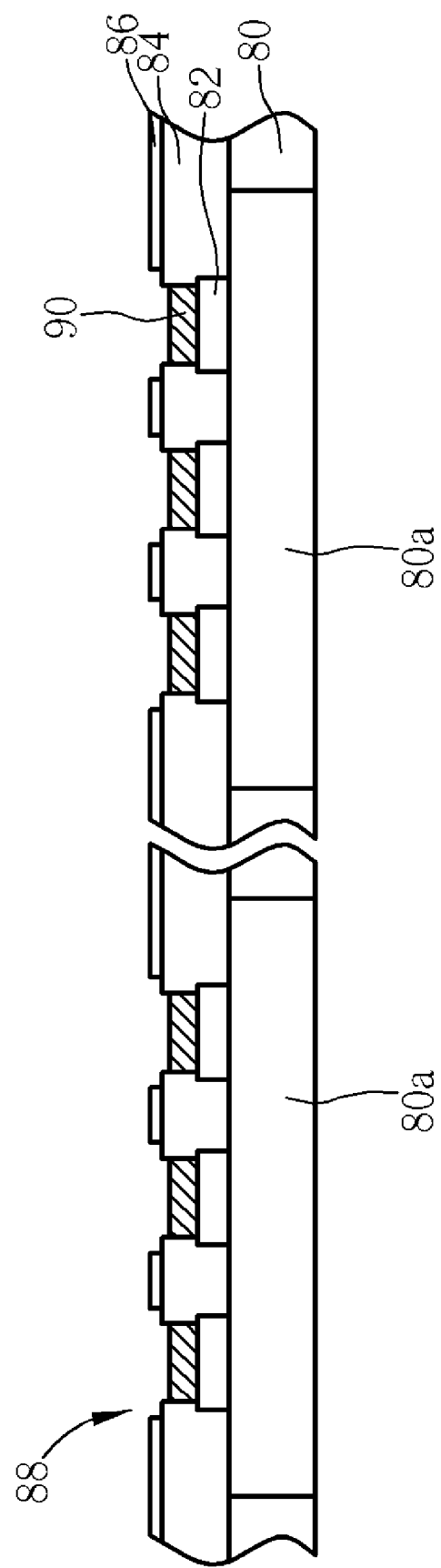
Figure 15:
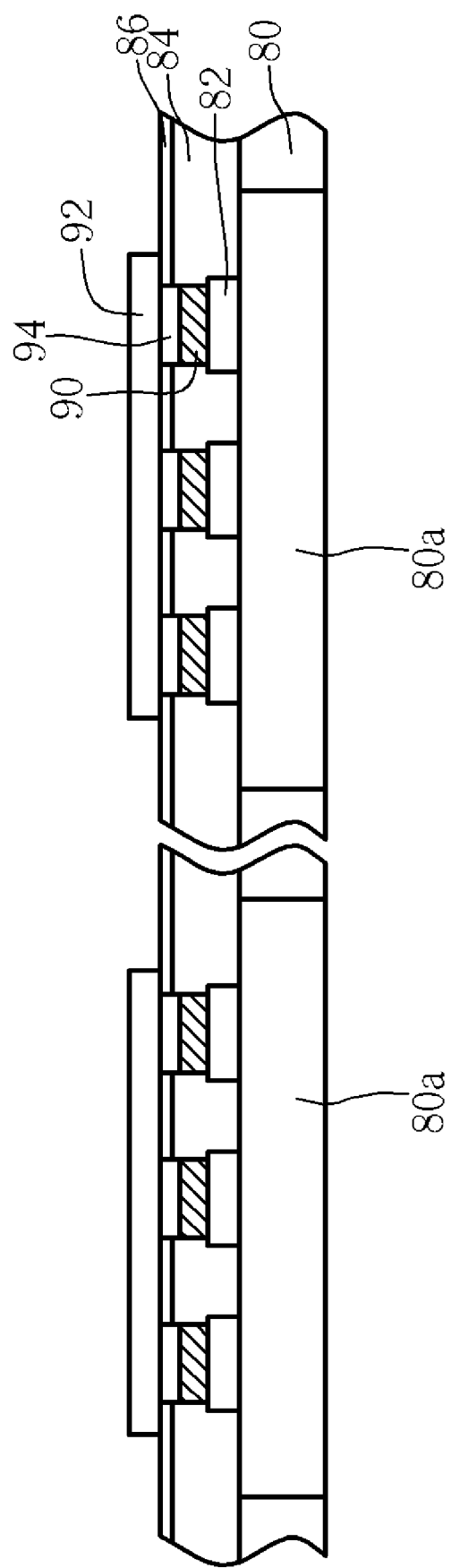

Next, a conductive material 90 such as solder, copper paste, or silver paste is disposed into each opening 88, in which the conductive material 90 is utilized as a connecting agent for electrically connecting to the chip 92, as shown in FIG. 14. Next, a plurality of chips 92 are provided and each chip 92 is mounted to the surface of each IC package substrate unit 80a, in which the bottom surface of the chip 92 includes a plurality of conductive bumps 94, as shown in FIG. 15. Preferably, each chip 92 is able to be slightly pushed into the second insulating layer 86 during the mounting process. Next, a curing process is performed to harden the second insulating layer 86 which has been pre-cured and to establish a tight bonding among each connecting pad 82, the conductive material 90, and each conductive bump 94. Similar to the previous embodiments, a pre-curing adhesive layer (not shown) can also be formed over the bottom surface of the chip 92 for increasing the adhesiveness between the chip 92 and the pre-cured second insulating layer 86. Next, a solder ball mounting process (not shown) is performed to form a plurality of solder balls on the plurality of solder pads (not shown) of the bottom surface of the substrate 80. Lastly, the substrate 80 is divided into a plurality of flip chip packaging structures, in which the surface of each flip chip packaging structure includes at least one chip 92.

Figure 16:
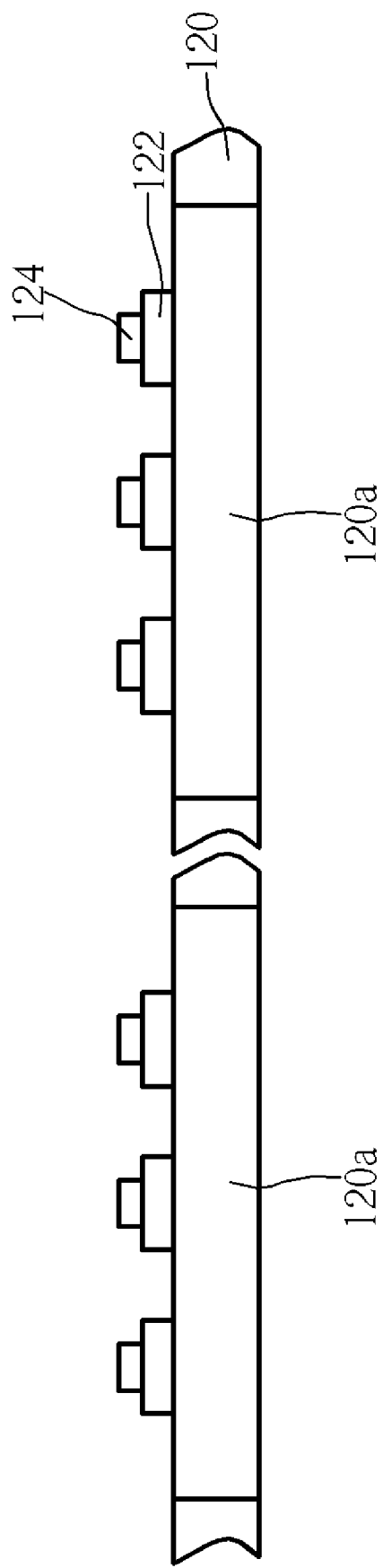
FIG. 16 through FIG. 18 are perspective diagrams showing the flip chip packaging method according to the fourth embodiment of the present invention.
Figure 17:
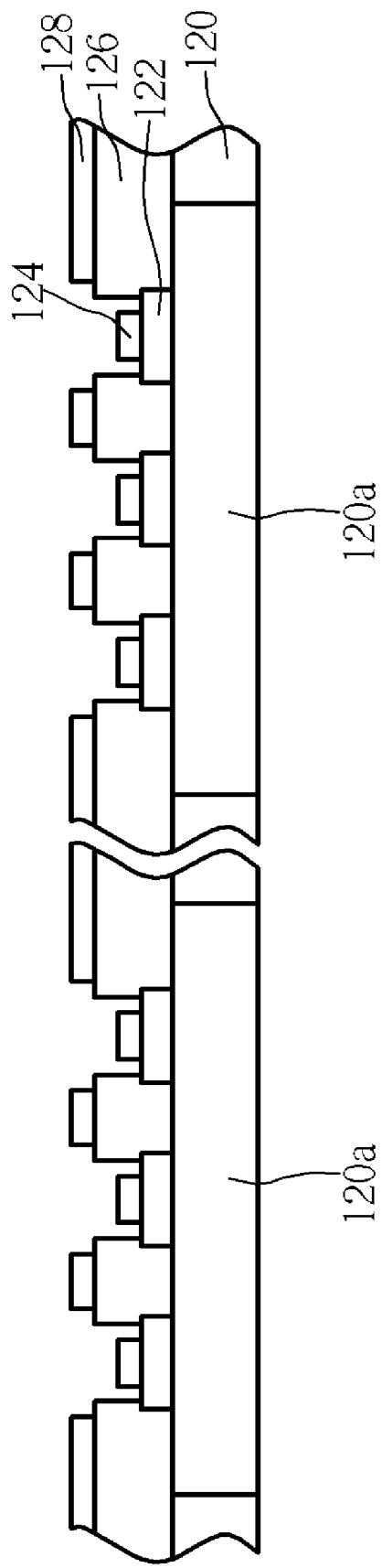
Figure 18:
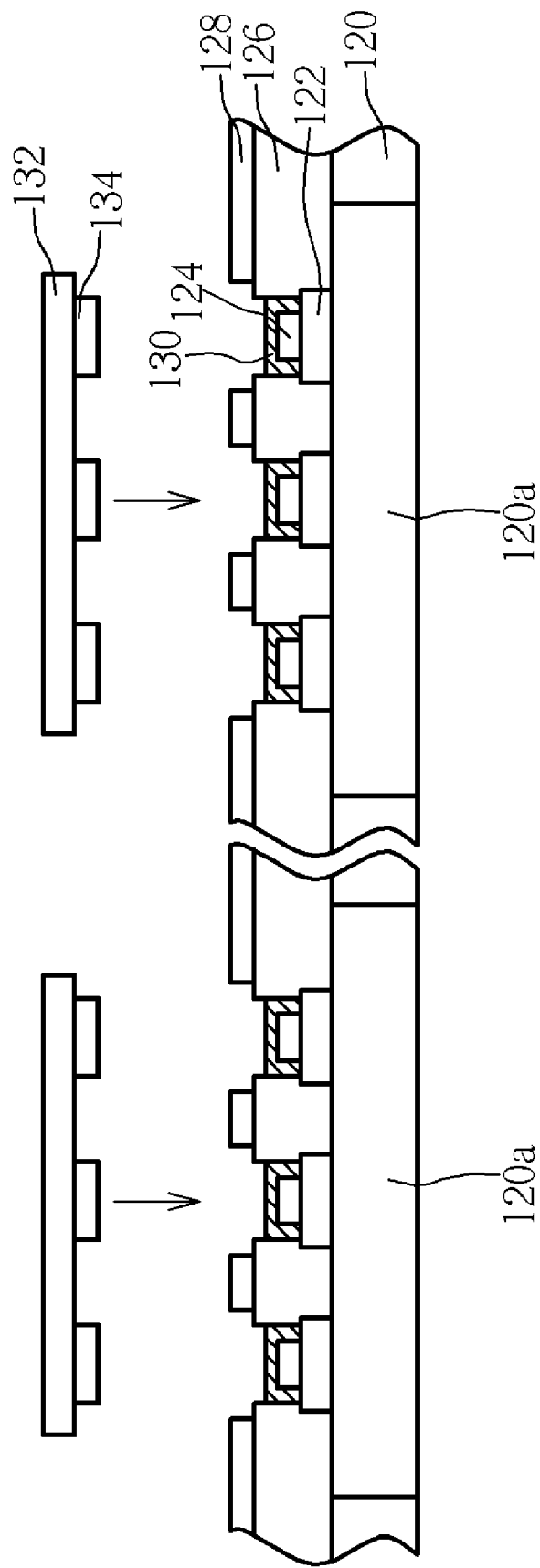

Please refer to FIG. 16 through FIG. 18. FIG. 16 through FIG. 18 are perspective diagrams showing the flip chip packaging method according to the fourth embodiment of the present invention. As shown in FIG. 16, a package substrate 120, such as a circuit board with a build up circuit layer is first provided. The substrate 120 includes a plurality of IC package substrate units 120a therein, in which at least one metal inter-connective layer (not shown) is formed within each IC package substrate unit 120a and a plurality of connecting pads 122 is disposed over the surface of the IC package substrate unit 120a. Next, a metal bump 124 is formed in the center surface of each connecting pad 122 for increasing the adhesive area and heat distribution between the conductive material 130 formed afterwards and the connecting pads 122. Next, a first insulating layer 126 with patterns is formed on the substrate 120 and the connecting pads 122, in which a plurality of openings is formed by partially exposing the upper surface of the connecting pads 122, as shown in FIG. 17. Next, a second insulating layer 128 with patterns is disposed over the surface of the first insulating layer 126, in which the openings are exposed. Similar to the previous embodiment, the first insulating layer 126 is a fully cured material whereas the second insulating layer 128 is a pre-curing material, in which the first insulating layer 126 and the second insulating layer 128 are utilized as an adhesive layer between the substrate 120 and other chips 132. Additionally, the first insulating layer 126 and the second insulating layer 128 can be made of same or different materials, such that the materials can be selected from photosensitive or non-photosensitive polymer resins, or materials utilized from the previous embodiments of the present invention.

Next, a conductive material 130 such as solder, copper paste, or silver paste is disposed into each opening, in which the conductive material 130 is utilized as a connecting agent for electrically connecting to the chip 132, as shown in FIG. 18. Next, a plurality of chips 132 is mounted to the surface of each IC package substrate unit 120a via the second insulating layer 128, in which the bottom surface of the chip 132 also includes a plurality of conductive bumps 134. Preferably, a pre-curing adhesive layer (not shown) can also be formed over the bottom surface of the chip 132 for mounting each chip 132 onto the surface of the IC package substrate unit 120a. Next, a curing process is performed to harden the second insulating layer 128 which has been pre-cured and to establish a tight bonding among the connecting pads 122, the metal bumps 124, the conductive material 130, and the conductive bumps 134. Next, a solder ball mounting process (not shown) is performed to form a plurality of solder balls on the plurality of solder pads (not shown) of the bottom surface of each substrate 120. Lastly, the substrate 120 is divided into a plurality of flip chip packaging structures, in which the surface of each flip chip packaging structure includes at least one chip 132.

Figure 19:
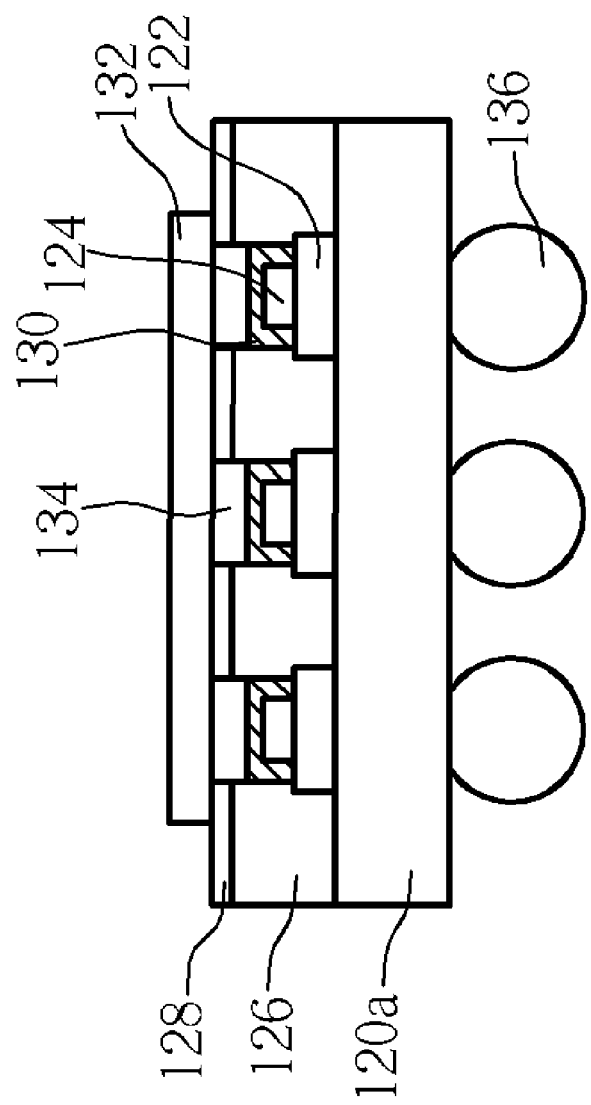
FIG. 19 is a perspective diagram showing a flip chip packaging structure according to the present invention.

Please refer to FIG. 19. FIG. 19 is a perspective diagram showing a flip chip packaging structure 118 according to the present invention. As shown in FIG. 19, the flip chip packaging structure 118 includes an IC package substrate unit 120a, in which a plurality of connecting pads 122 is disposed over the surface of the IC package substrate unit 120a; a first insulating layer 126 with patterns disposed on the IC package substrate unit 120a and the connecting pads 122, in which a plurality of openings is formed by partially exposing the upper surface of the connecting pads 122; a second insulating layer 128 disposed over the surface of the first insulating layer 126, in which the openings are further exposed; a conductive material 130 disposed within each opening; and a chip 132 mounting on the surface of the IC package substrate unit 120a via the second insulating layer 128, in which a plurality of conductive bumps 134 is disposed over the bottom surface of the chip 132. Additionally, a plurality of solder balls 136 can be disposed over the bottom surface of IC package substrate unit 120a for providing an electrical connection to the external devices. Moreover, the bottom surface of the each chip 132 may also include a pre-curing adhesive layer (not shown) disposed between the conductive bumps 134 for increasing the adhesiveness between the chip 132 and the first insulating layer 126 and second insulating layer 128. Moreover, a metal bump 124 can be added onto the surface of each connecting pad 122 for increasing the adhesive area between the conductive material 130 and each connecting pad 122.

By utilizing a pre-cured adhesive layer on the chip and forming a fully cured first insulating layer and a pre-cured second insulating layer over the surface of the substrate, the present invention is able to effectively increase the adhesion between the chip and the substrate, thereby eliminating the need of adding an underfill layer between chip and the package substrate. Consequently, by eliminating the use of an underfill layer, a solder mask layer between the connection points, and many times reflow process, the present invention is able to greatly increase the reliability of the product and reduce the problem of coefficient of thermal expansion incompatibility.

In contrast to the conventional method, the present invention discloses a method of directly mounting a chip onto the pre-cured insulating layer formed on the surface of a substrate and performing a separating process for dividing the finished substrate into a plurality of packaging structures, thereby reducing the number of packaging steps required, eliminating the problem of coefficient of thermal expansion incompatibility between materials used, and increasing the packaging quality and the production throughput.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flip chip packaging structure comprising:
   an IC package substrate unit, wherein the surface of each IC package substrate unit comprises a plurality of connecting pads and the surface of each connecting pad partially disposes a metal bump;
   an insulating layer with patterns formed on the IC package substrate unit and the connecting pads and a plurality of openings formed by partially exposing the upper surface of the connecting pads, wherein the width of the insulating layer is equivalent to the width of the IC package substrate unit;
   a conductive material disposed within each opening to fully cover the surface of the connecting pads and the metal bumps; and
   a chip, wherein the bottom surface of the chip further comprises a plurality of conductive bumps, such that the chip is mounted to the surface of the IC package substrate unit via the insulating layer.

2. The flip chip packaging structure of claim 1, wherein the conductive material comprises solder, copper paste, or silver paste.

3. The flip chip packaging structure of claim 1, wherein the insulating layer is a pre-curing adhesive layer.

4. The flip chip packaging structure of claim 1, wherein the insulating layer comprises photosensitive or non-photosensitive polymer resins.

5. The flip chip packaging structure of claim 1, wherein the bottom surface of each chip further comprises a pre-curing adhesive layer disposed between the conductive bumps.

6. A flip chip packaging structure further comprising:
   an IC package substrate unit, wherein the surface of each IC package substrate unit comprises a plurality of connecting pads and the surface of each connecting pad partially disposes a metal bump;
   a first insulating layer with patterns formed on the IC package substrate unit and the connecting pads and a plurality of openings formed by partially exposing the upper surface of the connecting pads, wherein the width of the first insulating layer is equivalent to the width of the IC package substrate unit;
   a second insulating layer with patterns disposed over the surface of the first insulating layer, wherein the openings are partially exposed and the width of the second insulating layer is equivalent to the width of the IC package substrate unit;
   a conductive material disposed within each opening to fully cover the surface of the connecting pads and the metal bumps; and
   a chip, wherein the bottom surface of the chip further comprises a plurality of conductive bumps, such that the chip is mounted to the surface of the IC package substrate unit via the second insulating layer.

7. The flip chip packaging structure of claim 6, wherein the conductive material comprises solder, copper paste, or silver paste.

8. The flip chip packaging structure of claim 6, wherein the first insulating layer is a fully cured material.

9. The flip chip packaging structure of claim 6, wherein the second insulating layer is a pre-curing material utilized as an adhesive layer between the IC package substrate unit and each chip.

10. The flip chip packaging structure of claim 6, wherein the first insulating layer and the second insulating layer are comprised of same or different material.

11. The flip chip packaging structure of claim 6, wherein the bottom surface of each chip further comprises a pre-curing adhesive layer disposed between the conductive bumps.

* * * * *